United States Patent
Kuroda

(10) Patent No.: US 7,254,072 B2
(45) Date of Patent: Aug. 7, 2007

(54) SEMICONDUCTOR MEMORY DEVICE HAVING HIERARCHICALLY STRUCTURED DATA LINES AND PRECHARGING MEANS

(75) Inventor: Naoki Kuroda, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/074,722

(22) Filed: Mar. 9, 2005

(65) Prior Publication Data

US 2005/0243621 A1 Nov. 3, 2005

(30) Foreign Application Priority Data

Apr. 28, 2004 (JP) ............................ 2004-134331

(51) Int. Cl.
*G11C 7/00* (2006.01)
(52) U.S. Cl. ............. 365/203; 365/230.06; 365/230.03
(58) Field of Classification Search ................ 365/203, 365/189.06
See application file for complete search history.

(56) References Cited

U.S. PATENT DOCUMENTS 4,777,625 A * 10/1988 Sakui et al. ................ 365/207
5,650,980 A * 7/1997 Sakurai et al. .............. 365/236
5,777,935 A 7/1998 Pantelakis et al.
6,930,939 B2 * 8/2005 Lim et al. .................... 365/203
7,002,855 B2 * 2/2006 Wijeratne et al. ....... 365/189.12

FOREIGN PATENT DOCUMENTS

JP 2000-030455 A 1/2000

* cited by examiner

*Primary Examiner*—Amir Zarabian
*Assistant Examiner*—Michael Weinberg
(74) *Attorney, Agent, or Firm*—McDermott Will & Emery LLP

(57) ABSTRACT

A semiconductor memory device is provided comprising precharge circuits corresponding to global data line pairs, but not a precharge circuit corresponding to a local data line pair. In a command waiting state, data line selection switches are controlled to be in a connected state, so that the local data line pair and the global data line pairs are precharged all together while being connected to each other. In a command executing state, one of the data line selection switches, the one being not required for command execution, is in an open state. Similarly, a semiconductor memory device comprising only a precharge circuit corresponding to a local data line pair can be provided.

6 Claims, 13 Drawing Sheets

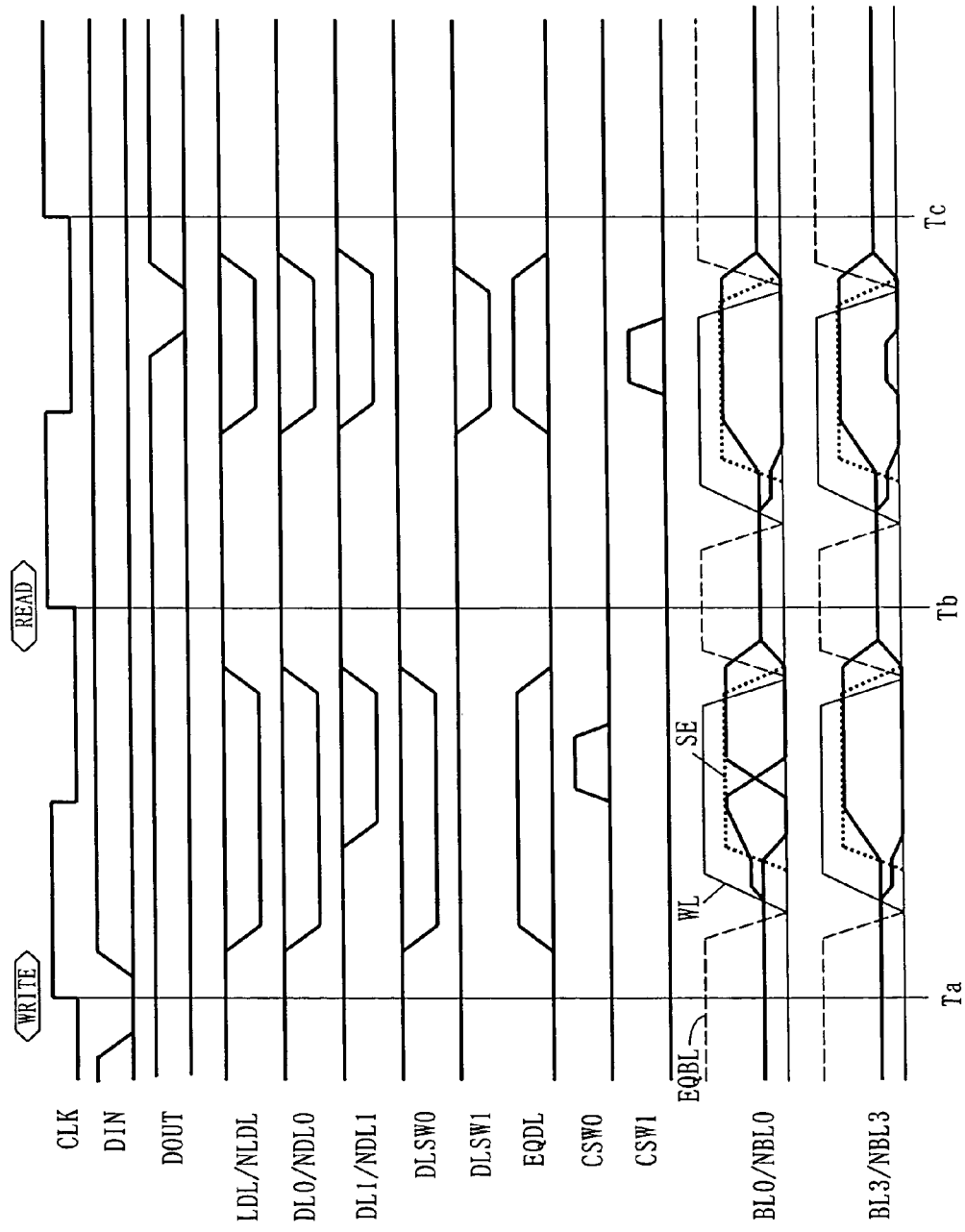

SEMICONDUCTOR MEMORY DEVICE HAVING HIERARCHICALLY STRUCTURED DATA LINES AND PRECHARGING MEANS

BACKGROUND OF THE INVENTION

1. Field of the Invention

The present invention relates to a semiconductor memory device, such as a dynamic random access memory or the like, and more preferably to a semiconductor memory device comprising hierarchically structured data lines.

2. Description of the Background Art

In high-density and large-volume semiconductor memory devices, such as a dynamic random access memory (hereinafter referred to as a DRAM) and the like, data is transferred between a memory cell and an I/O terminal using two kinds of wires having different wire loads, i.e., a bit line and a data line. The bit line is a wire having a sufficiently low wire load, which is used mainly to read/write a small amount of charge from/to a memory cell. The data line is a wire having a much larger wire load than that of the bit line, which is provided mainly on a memory array and is used to transfer data between the bit line and the I/O terminal.

FIG. 11 is a diagram showing a general structure of a semiconductor memory device. The semiconductor memory device of FIG. 11 comprises a plurality of memory cell groups 10a to 10n each including a plurality of memory cells 11, a plurality of sense amplifiers 12a to 12n, a plurality of column selection switches 13a to 13n, data line selection switches 21 and 22, a write buffer 23, and a read amplifier 24. Among them, the memory cell groups 10a to 10n, the sense amplifiers 12a to 12n and the column selection switches 13a to 13n constitute a memory array, while the data line selection switches 21 and 22, the write buffer 23 and the read amplifier 24 constitute a peripheral circuit 20. For example, data transfer between the memory cell 11 included in the memory cell group 10a and the input and output terminals DIN and DOUT is performed using bit lines BL0a to BL3a provided in the memory cell group 10a, global data lines DL0 and DL1 provided across the memory array, and a local data line LDL provided in the peripheral circuit 20.

To construct a large-volume and high-speed semiconductor memory device, it is necessary to cause the data line having a large wire load to operate with high speed. Conventionally, in order to cause the data line to operate with high speed, the following technique is widely used: a logically single data line is actually composed of two wires (hereinafter referred to as a data line pair), and a difference between complementary data flowing through the data line pair is detected and amplified. The lines BL0a to BL3a, the global data lines DL0 and DL1, and the local data line LDL of FIG. 11 are each composed of such a data line pair. Hereinafter, a method of precharging the data line pair will be described.

FIG. 12 is a diagram showing a structure of a conventional semiconductor memory device. FIG. 12 mainly shows a detailed structure of the peripheral circuit 20 of FIG. 11. In FIG. 12, the memory cell 11 is a cell for storing one-bit data. In accordance with signal EQBL and SE, the sense amplifier 12 amplifies data on bit line pairs BL0/NBL0 to BL3/NBL3 connected to the memory cell 11. In accordance with a write buffer control signal WB, the write buffer 23 writes data input from the input terminal DIN into the memory cell 11 via a local data line pair LDL/NLDL, global data line pairs DL0/NDL0 and DL1/NDL1, and the bit line pairs BL0/NBBL0 to BL3/NBL3. In accordance with a read amplifier control signal RA, the read amplifier 24 amplifies, with high speed, data on the global data line pairs DL0/NDL0 and DL1/NDL1 and the local data line pair LDL/NLDL, which has been read from the memory cell 11 and amplified by the sense amplifier 12.

The data line selection switches 21 and 22 connect no more than one of the two global data line pairs DL0/NDL0 and DL1/NDL1 with the local data line pair LDL/NLDL in accordance with data line selection signals DLSW0 and DLSW1. The column selection switch 13 connects no more than one of the two bit line pairs (e.g., BL0/NBL0, BL1/NBL1) with the global data line pair (e.g., DL0/NDL0) in accordance with column selection signals CSW0 and CSW1.

The semiconductor memory device 9 comprises three precharge circuits 91 to 93 for precharging the data line pairs for each bit of an input/output signal. The precharge circuits 91 to 93 each precharge a signal line in accordance with a precharge control signal EQDL. More specifically, the precharge circuit 91 precharges the global data line pair DL0/NDL0, the precharge circuit 92 precharges the global data line pair DL1/NDL1, and the precharge circuit 93 precharges the local data line pair LDL/NLDL. Thus, the semiconductor memory device 9 comprises the precharge circuits corresponding to the global data line pairs and the precharge circuit corresponding to the local data line pair.

A technique of precharging the data line in the semiconductor memory device 9 will be described with reference to FIG. 13. In the following description, it is assumed that a command (WRITE command) to write data "0" into a memory cell 11 connected to the bit line pair BL0/NBL0 (hereinafter referred to as a memory cell M0) is input at time Ta, and a command (READ command) to read data from a memory cell 11 connected to the bit line pair BL3/NBL3 (hereinafter referred to as a memory cell M3) is input at time Tb.

Before time Ta, the semiconductor memory device 9 is waiting for a command. In the command waiting state, the data line selection signals DLSW0 and DLSW1 are controlled to be in the inactive state (HIGH level), while the column selection signals CSW0 and CSW1 are also controlled to be in the inactive state (LOW level). Thereby, the local data line pair LDL/NLDL and the global data line pairs DL0/NDL0 and DL1/NDL1 are separated from each other. Also in the command waiting state, the precharge control signal EQDL is controlled to be in the active state (LOW level). Therefore, in the command waiting state, the local data line pair LDL/NLDL and the global data line pairs DL0/NDL0 and DL1/NDL1 are individually precharged to the HIGH level by the precharge circuits 91 to 93 while being separated from each other.

When the WRITE command is input at time Ta, the semiconductor memory device 9 is transitioned from the command waiting state to the command executing state. In this case, the precharge control signal EQDL is changed to the inactive state (HIGH level), resulting in stop of the operations of the precharge circuits 91 to 93. Therefore, the precharge of the local data line pair LDL/NLDL and the global data line pairs DL0/NDL0 and DL1/NDL1 is released, so that these signal lines become ready to be written with input data.

As a result of decoding an address designated by the WRITE command, the data line selection signal DLSW0 is changed into the active state (LOW level) and the column selection signal CSW0 is also changed into the active state (HIGH level). In addition to this, a word line WL0 is changed into the active state, so that the memory cell M0 is connected to the bit line pair BL0/NBL0. Thereby, data (e.g., "1") stored in the memory cell M0 is amplified by the sense amplifier 12 before being read out onto the bit line pair BL0/NBL0. The write buffer 23 overwrites the data "1" read out onto the bit line pair BL0/NBL0 with the data "0" designated by the WRITE command. At this time point, the semiconductor memory device 9 completes the write process.

After completion of the write process, the local data line pair LDL/NLDL and the global data line pairs DL0/NDL0 and DL1/NDL1 are precharged again to be ready for the next operation. During the precharge of these signal lines, the data line selection signals DLSW0 and DLSW1 are controlled to be in the inactive state. Therefore, the local data line pair LDL/NLDL and the global data line pairs DL0/NDL0 and DL1/NDL1 are separated from each other and are precharged individually.

Next, when the READ command is input at time Tb, the semiconductor memory device 9 is transitioned from the command waiting state to the command executing state as in when the WRITE command is input. Also in this case, the precharge control signal EQDL is changed into the inactive state, so that the precharge of the local data line pair LDL/NLDL and the global data line pairs DL0/NDL0 and DL1/NDL1 is released.

As a result of decoding an address designated by the READ command, the data line selection signal DLSW1 is changed into the active state (LOW level) and the column selection signal CSW1 is also changed into the active state (HIGH level). In addition to this, the word line WL0 is changed into the active state, so that the memory cell M3 is connected to the bit line pair BL3/NBL3. Thereby, data (e.g., "0") stored in the memory cell M3 is amplified by the sense amplifier 12 before being read out onto the bit line pair BL3/NBL3. The data is transmitted on the global data line pair DL1/NDL1 and the local data line pair LDL/NLDL to reach the read amplifier 24. Further, the read amplifier 24 amplifies the data read from the memory cell M3 and outputs the resultant data through the output terminal DOUT. At this time point, the semiconductor memory device 9 completes the read process.

After completion of the read process, the local data line pair LDL/NLDL and the global data line pairs DL0/NDL0 and DL1/NDL1 are precharged again to be ready for the next operation as in the completion of the write process.

As described above, the semiconductor memory device 9 comprises a bit line pair and two data line pairs (a local data line pair and a global data line pair) so as to transfer data between a memory cell and an I/O terminal. The two data line pairs are precharged individually while being separated from each other by the data line selection switches 21 and 22. Thus, by using a plurality of individual data line pairs to be precharged, the wire load of each data line is reduced, thereby making it possible to precharge the data line with high speed. The above-described technique of precharging a data line pair is generally used to achieve high-speed data transfer between a memory cell and an I/O terminal.

Another technique of precharging a data line pair has been known in which a power source circuit for a data line pair and a power source circuit for a sense amplifier are provided in a semiconductor memory device to separate an inner power source and an external power source (e.g., Japanese Patent Laid-Open Publication No. 2000-30455). According to this technique, even when current consumption during an operation of the sense amplifier changes a power source level and therefore the HIGH level of a bit line is changed, the precharge level of a data line follows that change, i.e., the data line precharge level itself is also changed. Therefore, data transfer between the bit line pair and the data line pair is not influenced by a change in the external power source and can be performed without error and with high speed.

However, the conventional semiconductor memory device comprises precharge circuits corresponding to the global data line pairs and the local data line pair. Therefore, the larger the number of precharge circuits, the larger the power consumption of the semiconductor memory device due to a charge/discharge current of a precharge control signal. Further, precharge circuits are laid out at intervals which are determined based on a bit line pitch, and therefore, the layout area is increased with an increase in the number of precharge circuits.

For example, in a semiconductor memory device in which one global data line pair is provided for two bit line pairs and one local data line pair is provided for four bit line pairs (FIG. 12), three precharge circuits are required for each bit of an input/output signal. Therefore, in this semiconductor memory device, the power consumption and the layout area are increased by an amount corresponding to the three precharge circuits. The increase of the power consumption and the layout area raises a particularly serious problem with a semiconductor memory device having a large input/output data width, such as an embedded DRAM included in a system-on-chip.

SUMMARY OF THE INVENTION

Therefore, an object of the present invention is to provide a semiconductor memory device having low power consumption and a small area by reducing the number of precharge circuits.

The present invention has the following features to attain the object mentioned above.

A first semiconductor memory device of the present invention having hierarchically structured data lines, comprises a plurality of memory cells disposed in a first direction and a second direction perpendicular to each other, a plurality of word lines disposed in the first direction and used for selecting the memory cells disposed in the second direction simultaneously, a plurality of bit lines disposed in the second direction, and connected to and shared by the memory cells disposed in the first direction, a plurality of sense amplifiers for amplifying signals on the bit lines, a write circuit for writing externally input data into the memory cell, a read circuit for outputting data read from the memory cell to an outside, a plurality of global data lines each provided corresponding to one or more of the bit lines, a local data line provided corresponding to two or more of the global data lines and connected to the write circuit and the read circuit, a plurality of data line selection switches provided corresponding to the global data lines and used for switching states of connection between the global data lines and the local data line, and a plurality of precharge circuits provided corresponding to the global data lines and operated in accordance with a received control signal. In a command waiting state, all of the data line selection switches are in a connected state and all of the precharge circuits are operated. Thereby, even in a semiconductor memory device comprising only a precharge circuit corresponding to a global data line, a local data line and a global data line can be appropriately precharged by controlling a data line selection switch in a preferable manner. As a result, the number of precharge circuits can be reduced, resulting in a decrease in the layout area and power consumption of the semiconductor memory device.

In this case, in a command executing state, the data line selection switch which is required for command execution may be held in a connected state while the other data line selection switch or switches are in an open state, and operations of all of the precharge circuits may be stopped. Thereby, the global data line which is required for the command execution is held connected to the local data line. As a result, it is possible to eliminate a time required for switching the connection states and reduce the access time.

More preferably, in a read command executing state, the data line selection switch which is not required for read command execution may be in the open state while the read circuit is receiving data. Thus, by receiving data while the wire load of the global data line is reduced, a time required for the read circuit to receive data can be reduced.

Alternatively, in a command executing state, the data line selection switch which is required for command execution may be held in a connected state while the other data line selection switch or switches may be in an open state, and an operation of the precharge circuit corresponding to the global data line which is required for the command execution may be stopped while operations of the other precharge circuit or circuits may be continued. Thus, since the data line which is not required for the command execution is held in a precharged state, thereby making it possible to reduce a precharge current in the data line which is not required for the command execution. As a result, the power consumption of the semiconductor memory device can be reduced.

Alternatively, the semiconductor memory device may further comprise a plurality of column selection switches provided corresponding to the bit lines and used for switching states of connection between the global data lines and the bit lines. In the command waiting state, all of the column selection switches may be in an open state. In a command executing state, the column selection switch which is required for command execution may be in a connected state while the other column selection switch or switches may be held in the open state. Thereby, only the sense amplifier which is required for the command execution is selectively operated, thereby making it possible to reduce a current flowing through the sense amplifier. As a result, the power consumption of the semiconductor memory device can be reduced. Further, the global data line which is not required for the command execution also functions as a shield line for the global data line required for the command execution. Thereby, noise interference between the global data lines can be suppressed, thereby making it possible to prevent a malfunction of the semiconductor memory device.

More preferably, the semiconductor memory device may further comprise a plurality of clamp transistors each having a drain terminal, a gate terminal and a source terminal and provided corresponding to the global data lines. The drain terminal and the gate terminal may be connected to the global data line and the source terminal may be connected to the same power source as that for the precharge circuit. All of the precharge circuits may be operated at the same timing. As a result, even when the precharge circuit is controlled using a simple method, the data line which is not required for command execution can effectively function as a shield line for the data line required for the command execution.

The data line selection switch and the precharge circuit may be each composed of a transistor having the same conductivity type. As a result, it is no longer necessary to provide an isolation region, thereby making it possible to reduce the layout area of a peripheral circuit.

A second semiconductor memory device having hierarchically structured data lines, comprises a plurality of memory cells disposed in a first direction and a second direction perpendicular to each other, a plurality of word lines disposed in the first direction and used for selecting the memory cells disposed in the second direction simultaneously, a plurality of bit lines disposed in the second direction, and connected to and shared by the memory cells disposed in the first direction, a plurality of sense amplifiers for amplifying signals on the bit lines, a write circuit for writing externally input data into the memory cell, a read circuit for outputting data read from the memory cell to an outside, a plurality of global data lines each provided corresponding to one or more of the bit lines, a local data line provided corresponding to two or more of the global data lines and connected to the write circuit and the read circuit, a plurality of data line selection switches provided corresponding to the global data lines and used for switching states of connection between the global data lines and the local data line, and a precharge circuit provided corresponding to the local data line and operated in accordance with a received control signal. In a command waiting state, all of the data line selection switches are in a connected state and the precharge circuits are operated. Thereby, even in a semiconductor memory device comprising only a precharge circuit corresponding to a local data line, a local data line and a global data line can be appropriately precharged by controlling a data line selection switch in a preferable manner. As a result, the number of precharge circuits can be reduced, resulting in a decrease in the layout area and power consumption of the semiconductor memory device. Particularly, the number of precharge circuits can be significantly reduced, thereby preventing the size of a precharge circuit from becoming a bottleneck for the layout. Thus, the bit lines can be disposed at a minimum bit line pitch, thereby making it possible to reduce the layout area of the memory array.

In this case, the precharge circuit may be operated before the semiconductor memory device is transitioned from a command executing state to the command waiting state and the data line selection switches may be temporarily in a connected state in a time-division manner. As a result, it is possible to prevent a single precharge circuit from precharging the local data line and the plurality of global data lines all together, thereby using a precharge circuit having substantially the same driving performance as conventional precharge circuits. Further, the wire load of the data lines which are simultaneously precharged can be reduced, thereby suppressing a voltage drop due to an increase in peak current.

Alternatively, the semiconductor memory device may further comprise a plurality of column selection switches provided corresponding to the bit lines and used for switching states of connection between the global data lines and the bit lines. In the command waiting state, all of the column selection switches may be in an open state. In a command executing state, the column selection switch which is required for command execution may be in a connected state while the other column selection switch or switches may be held in the open state. As a result, it is possible to selectively operate the sense amplifier which is required for the command execution, thereby reducing a current flowing through the sense amplifier. Therefore, the power consumption of the semiconductor memory device can be reduced. Further, the global data line which is not required for command execution also functions as a shield line for the global data line required for the command execution. Thereby, noise interference between the global data lines can be suppressed, thereby making it possible to prevent a malfunction of the semiconductor memory device.

More preferably, the semiconductor memory device may further comprise a plurality of clamp transistors each having a drain terminal, a gate terminal and a source terminal and provided corresponding to the global data lines, wherein the drain terminal and the gate terminal are connected to the global data line and the source terminal is connected to the same power source as that for the precharge circuit. As a result, the data line which is not required for command execution can effectively function as a shield line for the data line required for the command execution.

As described above, according to the semiconductor memory device of the present invention, the local data line and the global data line are used to hierarchically construct data lines. Therefore, even when only a precharge circuit corresponding to any one of the local data line or the global data line is provided, the data line selection switch can be controlled in a preferable manner, thereby making it possible to appropriately precharge the local data line and the global data line. Therefore, the number of precharge circuits can be reduced, thereby decreasing the layout area and the power consumption. As a result, the access time can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a timing chart of a conventional semiconductor memory device.

DESCRIPTION OF THE PREFERRED EMBODIMENTS

Hereinafter, structures of semiconductor memory devices according to first to third embodiments of the present invention will be described with reference to the accompanying drawings. In each embodiment, the peripheral circuit will be mainly described in detail.

First Embodiment

Figure 1:
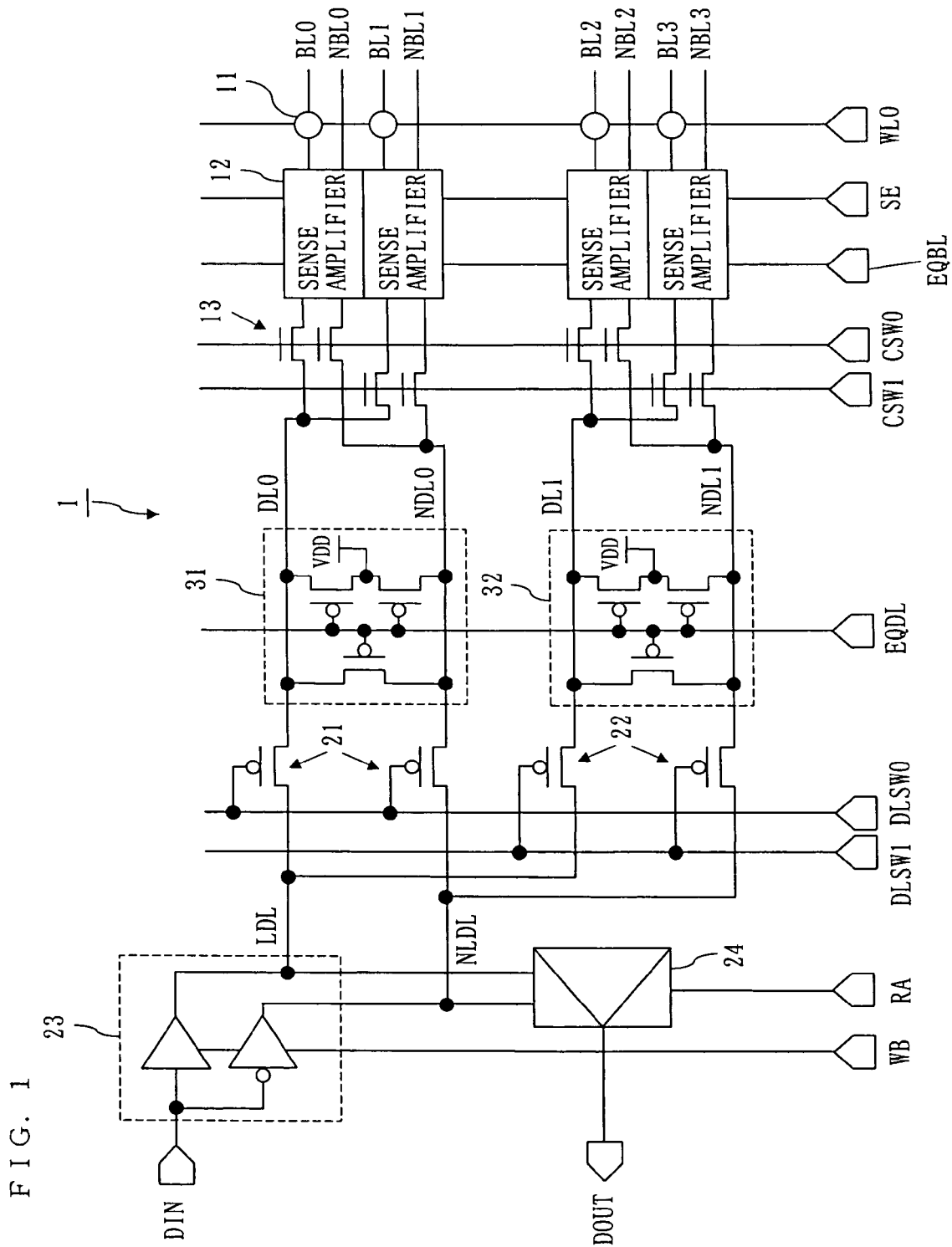
FIG. 1 is a diagram showing a structure of a semiconductor memory device according to a first embodiment of the present invention.

FIG. 1 is a diagram showing a structure of a semiconductor memory device according to a first embodiment of the present invention. The semiconductor memory device 1 of FIG. 1 comprises memory cells 11, sense amplifiers 12, column selection switches 13, data line selection switches 21 and 22, a write buffer 23, a read amplifier 24, and precharge circuits 31 and 32. The semiconductor memory device 1 further comprises a word line WL0, bit line pairs BL0/NBL0 to BL3/NBL3, a local data line pair LDL/NLDL, and global data line pairs DL0/NDL0 and DL1/NDL1. Among the components of FIG. 1, the memory cells 11, the sense amplifiers 12 and the column selection switches 13 constitute a memory array, while the data line selection switches 21 and 22, the write buffer 23, the read amplifier 24 and the precharge circuits 31 and 32 constitute a peripheral circuit. The global data line pairs DL0/NDL0 and DL1/NDL1 are provided mainly on the memory cell array, while the local data line pair LDL/NLDL is provided in the peripheral circuit.

In FIG. 1, each memory cell 11 is a cell for storing one-bit data. The memory cells 11 are arranged two-dimensionally, i.e., in a row direction and a column direction which are perpendicular to each other. Hereinafter, in figures showing circuit structures, for the sake of convenience, a vertical direction and a horizontal direction are referred to as a row direction and a column direction, respectively. In FIG. 1, one memory cell 11 is provided at each intersection of the word line WL0 and the bit line pairs BL0/NBL0 to BL3/NBL3, i.e., a total of four memory cells 11 are provided. Although only four memory cells 11 are shown in FIG. 1 for the sake of simplicity, the semiconductor memory device generally has a large number of memory cells 11, where one memory cell 11 is provided at each intersection of a plurality of word lines and a plurality of bit line pairs.

In accordance with signal EQBL and SE, the sense amplifiers 12 are provided corresponding to the bit line pairs BL0/NBL0 to BL3/NBL3 and amplify a signal on the respective bit line pairs. In accordance with a write buffer control signal WE. the write buffer 23 writes data input from an input terminal DIN into the memory cell 11 via the local data line pair LDL/NLDL, the global data line pairs DL0/NDL0 and DL1/NDL1 and the bit line pairs BL0/NBBL0 to BL3/NBL3. In accordance with a read amplifier control signal RA, the read amplifier 24 amplifies, with high speed, data on the global data line pairs DL0/NDL0 and DL1/NDL1 and the local data line pair LDL/NLDL, the data having been read out from the memory cell 11 and amplified by the sense amplifier 12.

In a command executing state, the data line selection switches 21 and 22 and the column selection switch 13 connect one of the four memory cells 11 with the input terminal DIN (in a write process) or an output terminal DOUT (in a read process). More specifically, the data line selection switch 21 switches the connection between the local data line pair LDL/NLDL and the global data line pair DL0/NDL0 in accordance with a data line selection signal DLSW0. The data line selection switch 22 switches the connection between the local data line pair LDL/NLDL and the global data line pair DL1/NDL1 in accordance with the data line selection signal DLSW1. The column selection switch 13 switches the connection between two bit line pairs (e.g., BL0/NBL0, BL1/NBL1) and a global data line pair (e.g., DL0/NDL0) in accordance with the column selection signals CSW0 and CSW1. By using the data line selection switches 21 and 22 and the column selection switch 13, one of the four memory cells 11 is selected, so that data transfer is enabled between the selected memory cell and the input and output terminals DIN and DOUT. Note that these switches are connected when a control signal given thereto is in the active state, and are open when the control signal is in the inactive state.

The semiconductor memory device 1 comprises two precharge circuits 31 and 32 for each bit of an input/output signal so as to precharge the data line pairs. The precharge circuits 31 and 32 each precharge the signal line in accordance with a precharge control signal EQDL. More specifically, the precharge circuit 31 is provided corresponding to the global data line pair DL0/NDL0 and precharges mainly the global data line pair DL0/NDL0 in accordance with the precharge control signal EQDL. On the other hand, the precharge circuit 32 is provided corresponding to the global data line pair DL1/NDL1 and precharges the global data line pair DL1/NDL1 in accordance with the precharge control signal EQDL. The semiconductor memory device 1 comprises only the precharge circuits corresponding to the global data line pairs, but not a precharge circuit corresponding to the local data line pair. Therefore, the precharge of the local data line pair LDL/NLDL is performed by the precharge circuits 31 and 32 as described below.

A method of precharging the data lines in the semiconductor memory device 1 will be described with reference to FIG. 2. In the following description, it is assumed that a command (WRITE command) to write data "0" into a memory cell M0 (a memory cell 11 provided at an intersection of the word line WL0 and the bit line pair BL0/NBL0) is input at time Ta, and a command (READ command) to read data from a memory cell M3 (a memory cell 11 provided at an intersection of the word line WL0 and the bit line pair BL3/NBL3) is input at time Tb. Note that timing charts (FIGS. 3, 5 and 7) described below show situations where the two commands are input as described above.

Before time Ta, the semiconductor memory device 1 is waiting for a command. In the command waiting state, the data line selection signals DLSW0 and DLSW1 are controlled to be in the active state (LOW level), while the column selection signals CSW0 and CSW1 are controlled to be in the inactive state (LOW level). Thereby, the local data line pair LDL/NLDL and the global data line pairs DL0/NDL0 and DL1/NDL1 are connected to each other. On the other hand, the global data line pairs DL0/NDL0 and DL1/NDL1 are separated from the bit line pairs BL0/NBL0 to BL3/NBL3. Also in the command waiting state, the precharge control signal EQDL is controlled to be in the active state (LOW level). Therefore, in the command waiting state, the local data line pair LDL/NLDL and the global data line pairs DL0/NDL0 and DL1/NDL1 are precharged all together to the HIGH level by the precharge circuits 31 and 32 while being connected to each other.

When the WRITE command is input at time Ta, the semiconductor memory device 1 is transitioned from the command waiting state to the command executing state. In this case, the precharge control signal EQDL is changed to the inactive state (HIGH level), resulting in stop of the operations of the precharge circuits 31 and 32. Therefore, the precharge of the local data line pair LDL/NLDL and the global data line pairs DL0/NDL0 and DL1/NDL1 is released, so that these signal lines become ready to be written with input data.

As a result of decoding an address designated by the WRITE command, the data line selection signal DLSW0 required for execution of the command is held in the active state (LOW level), while the other data line selection signal DLSW1 is changed into the inactive state (HIGH level). Also, the column selection signal CSW0 required for execution of the command is changed into the active state (HIGH level), while the other column selection signal CSW1 is held in the inactive state (LOW level). In addition to this, the word line WL0 is changed into the active state, so that the memory cell M0 is connected to the bit line pair BL0/NBL0. Thereby, data (e.g., "1") stored in the memory cell M0 is amplified by the sense amplifier 12 before being read out onto the bit line pair BL0/NBL0. The write buffer 23 overwrites the data "1" read out onto the bit line pair BL0/NBL0 with the data "0" designated by the WRITE command. At this time point, the semiconductor memory device 1 completes the write process.

While the write process is being performed with respect to the memory cell M0, the global data line pair DL1/NDL1 which is not required for execution of the command is connected via the column selection switch 13 to the sense amplifier 12 corresponding to the bit line pair BL2/NBL2. Therefore, the sense amplifier 12 amplifies data which is read from a memory cell 11 provided at an intersection of the word line WL0 and the bit line pair BL2/NBL2 (hereinafter referred to as a memory cell M2) onto the bit line pair BL2/NBL2, in combination with the wire load of the global data line pair DL1/NDL1.

After completion of the write process, the data line selection signals DLSW0 and DLSW1 and the column selection signals CSW0 and CSW1 are returned to the same values as those in the command waiting state. More specifically, the data line selection signal DLSW1 is changed into the active state (LOW level), and the column selection signal CSW0 is changed into the inactive state (LOW level). Substantially at the same time as the change of the data line selection signal DLSW1, the precharge control signal EQDL is changed into the active state (HIGH level). As a result, the local data line pair LDL/NLDL and the global data line pairs DL0/NDL0 and DL1/NDL1 are precharged all together by the precharge circuits 31 and 32 while being connected to each other.

Next, when the READ command is input at time Tb, the semiconductor memory device 1 is transitioned from the command waiting state to the command executing state as in when the WRITE command is input. Also in this case, the precharge control signal EQDL is changed into the inactive state, so that the precharge of the local data line pair LDL/NLDL and the global data line pairs DL0/NDL0 and DL1/NDL1 is released.

As a result of decoding an address designated by the READ command, the data line selection signal DLSW1 required for execution of the command is held in the active state (LOW level) and the other data line selection signal DLSW0 is changed into the inactive state (HIGH level). The column selection signal CSW1 required for execution of the command is also changed into the active state (HIGH level) and the other column selection signal CSW0 is held in the inactive state (LOW level). In addition to this, the word line WL0 is changed into the active state, so that the memory cell M3 is connected to the bit line pair BL3/NBL3. Thereby, data (e.g., "0") stored in the memory cell M3 is amplified by the sense amplifier 12 before being read out onto the bit line pair BL3/NBL3. The data is transmitted on the global data line pair DL1/NDL1 and the local data line pair LDL/NLDL to reach the read amplifier 24. The read amplifier 24 amplifies the data read from the memory cell M3 again and outputs the data through the output terminal DOUT. At this time point, the semiconductor memory device 1 completes the read process.

After completion of the read process, the data line selection signal DLSW0 is changed into the active state (LOW level) and the column selection signal CSW1 is changed into the inactive state (LOW level), as in the completion of the write process. Also, at substantially the same time as the change of the data line selection signal DLSW0, the precharge control signal EQDL is changed into the active state (HIGH level). Thereby, the local data line pair LDL/NLDL and the global data line pairs DL0/NDL0 and DL1/NDL1 are precharged all together by the precharge circuits 31 and 32 while being connected to each other.

As described above, the semiconductor memory device 1 of the first embodiment comprises the precharge circuits corresponding to the global data line pairs, but not a precharge circuit corresponding to the local data line pair. In the command waiting state, the data line selection switches 21 and 22 are in the connected state, so that the precharge circuits 31 and 32 perform a precharge operation. Thereby, in the command waiting state, the local data line pair and the global data line pairs are precharged all together while being connected to each other. Therefore, the semiconductor memory device 1 can appropriately precharge the local data line pair and the global data line pairs without a precharge circuit corresponding to the local data line pair. Therefore, the layout area of the peripheral circuit can be reduced by an amount corresponding to a precharge circuit corresponding to the local data line pair. For example, a certain semiconductor memory device was produced using a 0.13-µm process. In this semiconductor memory device, the layout area of the peripheral circuit could be reduced by about 10% as compared to conventional semiconductor memory devices.

Further, in the semiconductor memory device 1, the local data line pair is provided corresponding to a plurality of the global data line pairs, and is precharged by a plurality of the precharge circuits provided corresponding to the global data line pairs. Therefore, a load of precharge is reduced as compared to when a single precharge circuit is used to precharge the local data line pair, resulting in a decrease in the overhead of a precharge time. Also by reducing the number of precharge circuits, the number of precharge control signals can be reduced, resulting in a decrease in the power consumption of the semiconductor memory device.

Furthermore, when the semiconductor memory device 1 is in the command executing state, one of the data line selection signals DLSW0 and DLSW1 which is required for command execution is held in the active state. Therefore, no time margin is required after the data line selection switches 21 and 22 are changed into the connected state and until the write buffer 23 or the read amplifier 24 is activated. Therefore, an access time from input of a command to output of data can be reduced. For example, in the semiconductor memory device which was produced using the 0.13-µm process, the access time could be reduced by about 5% as compared to that of conventional semiconductor memory devices.

Next, another method of precharging the data lines will be described with reference to FIG. 3. When the precharge method of FIG. 3 is used in the semiconductor memory device 1, one of the data line selection switches 21 and 22, the one being not required for execution of the READ command, is in the open state while the read amplifier 24 is receiving data. In FIG. 3, each signal line is changed as in FIG. 2 in a time zone before time Tb (i.e., the command waiting state and the WRITE command executing state), and will not be explained.

Figure 2:
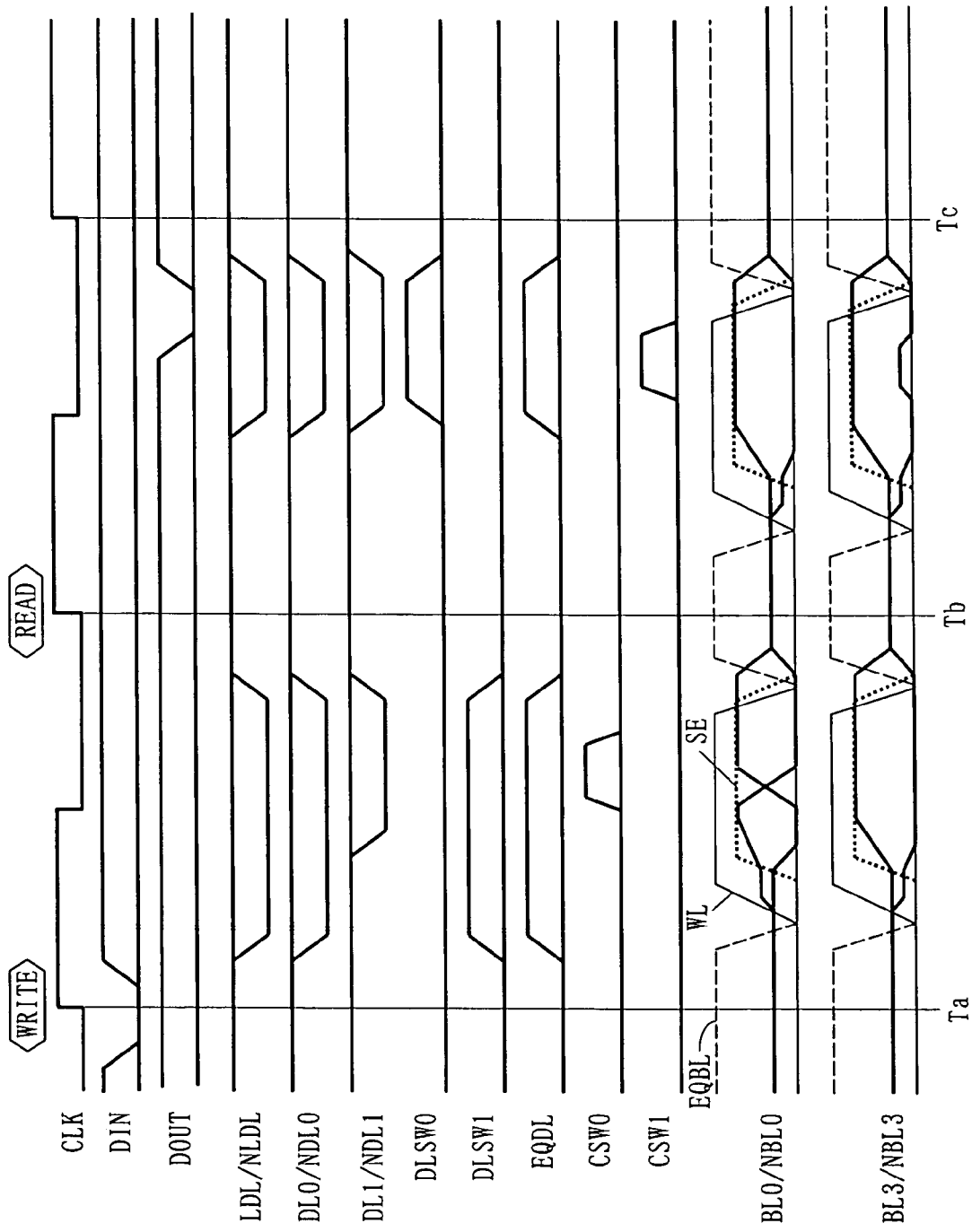
FIG. 2 is a timing chart of the semiconductor memory device of the first embodiment of the present invention.
Figure 3:
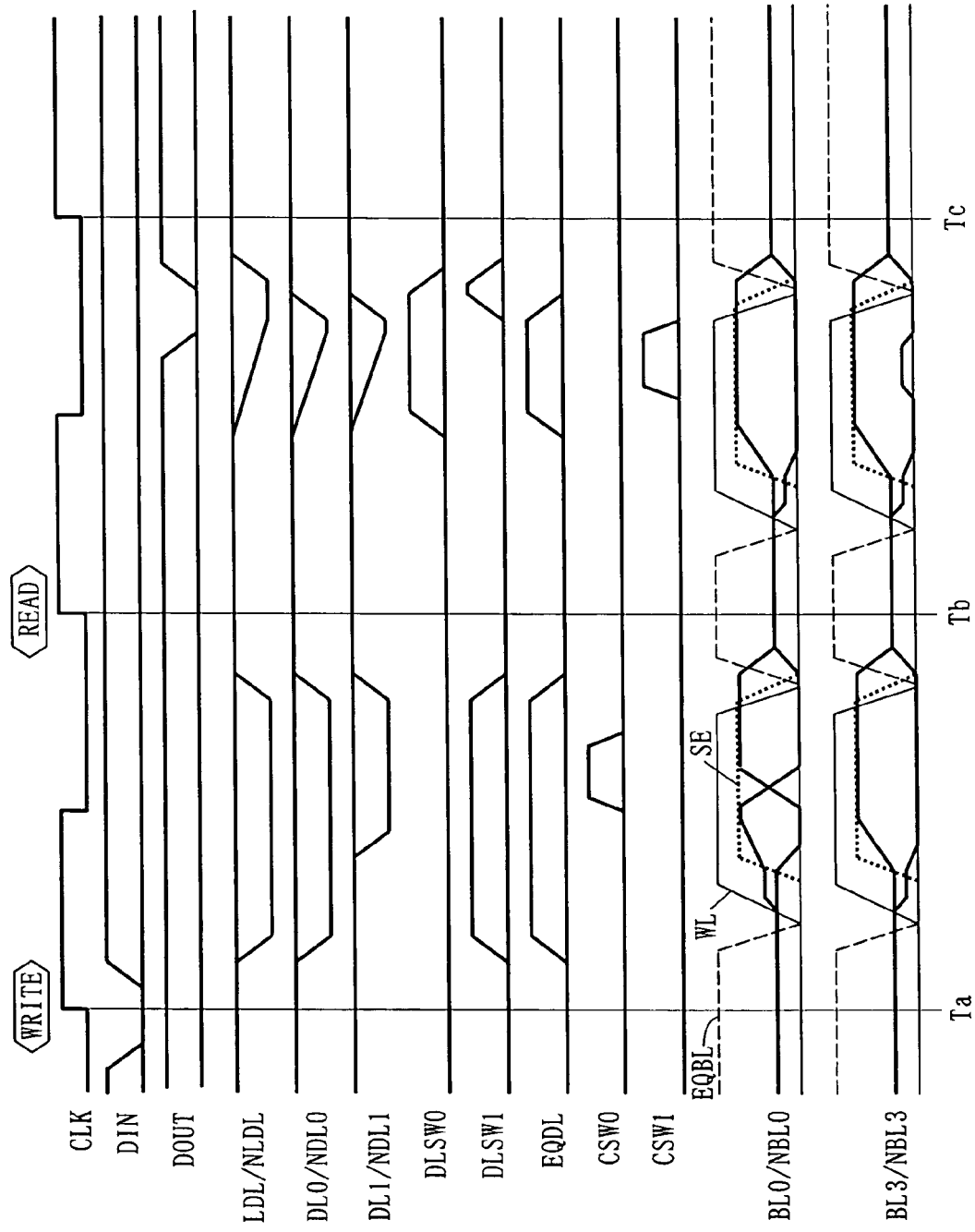
FIG. 3 is another timing chart of the semiconductor memory device of the first embodiment of the present invention.

When the READ command is input at time Tb, each signal is changed in the same manner as that of FIG. 2 until completion of the read process. Specifically, the precharge of the local data line pair LDL/NLDL and the global data line pairs DL0/NDL0 and DL1/NDL1 is released. As a result of decoding an address designated by the READ command, the data line selection signal DLSW0 is changed into the inactive state and the column selection signal CSWL is changed into the active state. Further, the word line WL0 is changed into the active state, so that the memory cell M3 is connected to the bit line pair BL3/NBL3. Thereby, data (e.g., "0") stored in the memory cell M3 is amplified by the sense amplifier 12 before being read out onto the bit line pair BL3/NBL3. The data is transmitted on the global data line pair DL1/NDL1 and the local data line pair LDL/NLDL to reach the read amplifier 24. Further, the read amplifier 24 amplifies the data and outputs the resultant data through the output terminal DOUT.

In the precharge method of FIG. 3, at substantially the same time when the read amplifier 24 is activated to start receiving data, the data line selection signal DLSW1 is changed into the inactive state (HIGH level), the column selection signal CSW1 is changed into the inactive state (LOW level), and the precharge control signal EQDL is changed into the active state (LOW level). In this case, the data line selection signal DLSW0 is held in the inactive state (HIGH level), so that the local data line pair LDL/NLDL and the global data line pairs DL0/NDL0 and DL1/NDL1 are separated from each other. Therefore, the precharge circuit 31 precharges only the global data line pair DL0/NDL0, while the precharge circuit 32 precharges only the global data line pair DL1/NDL1.

Next, after completion of data reception of the read amplifier 24, the data line selection signals DLSW0 and DLSW1 are changed into the active state (LOW level) again. Thereby, the local data line pair LDL/NLDL and the global data line pairs DL0/NDL0 and DL1/NDL1 are connected to each other, so that the precharge circuits 31 and 32 mainly precharge the local data line pair LDL/NLDL. In the precharge method of FIG. 3, the local data line pair LDL/NLDL and the global data line pairs DL0/NDL0 and DL1/NDL1 are precharged in different time zones.

As described above, when the precharge method of FIG. 3 is used in the semiconductor memory device 1, one of the data line selection switches 21 and 22, the one being not required for execution of the READ command, is in the open state while the read amplifier 24 is receiving data. By receiving data in a state such that the wire load of the global data line is reduced, the data latch time of the read amplifier 24 can be reduced.

Further, by precharging a global data line pair while the read amplifier 24 is outputting data, the precharge time of the global data line pair can be absorbed into the access time. This effect is significant, particularly when the data line is divided in a manner such that the load of the global data line is large and the load of the local data line is small. Also, by shifting a precharge time between the local data line pair and the global data line pair, peak values of currents required for precharge can be scattered. Therefore, it is possible to prevent an operational failure which is otherwise caused by a local power source drop.

In the precharge method of FIG. 3, it is assumed that the data line selection signals DLSW0 and DLSW1 are changed into the inactive state at substantially the same time as the activation of the read amplifier 24. Alternatively, the data line selection signals DLSW0 and DLSW1 may be changed at a timing different from that of FIG. 3 as long as the global data line pair is precharged by the time of completion of outputting data and the local data line pair and the global data line pair are precharged during different time zones.

In the precharge methods of the first embodiment of FIGS. 2 and 3, a data line is precharged to the HIGH level. Alternatively, a data line is precharged to the LOW level. Still alternatively, ½·H precharge may be performed with respect to the data line.

In the first embodiment, one local data line pair is provided corresponding to two global data line pairs. Alternatively, for example, one local data line pair may be provided corresponding to four global data line pairs. Still alternatively, when the wire loads of the global data line pair and the local data line pair are relatively small, one precharge circuit may be provided corresponding to a plurality of global data line pairs. For example, when one precharge circuit is provided corresponding to two global data line pairs, the number of precharge circuits can be further reduced.

Also in the first embodiment, the data line selection switches 21 and 22 and the precharge circuits 31 and 32 are composed of transistors having the same conductivity type (P-channel transistors in FIG. 1). By using transistors having the same conductivity type, no isolation region is required, thereby making it possible to reduce the layout area of the peripheral circuit. Note that the data line selection switches 21 and 22 and the precharge circuit 31 may be composed of N-channel transistors. Needless to say, the data line selection switches 21 and 22 may be composed of CMOS devices.

Second Embodiment

Figure 4:
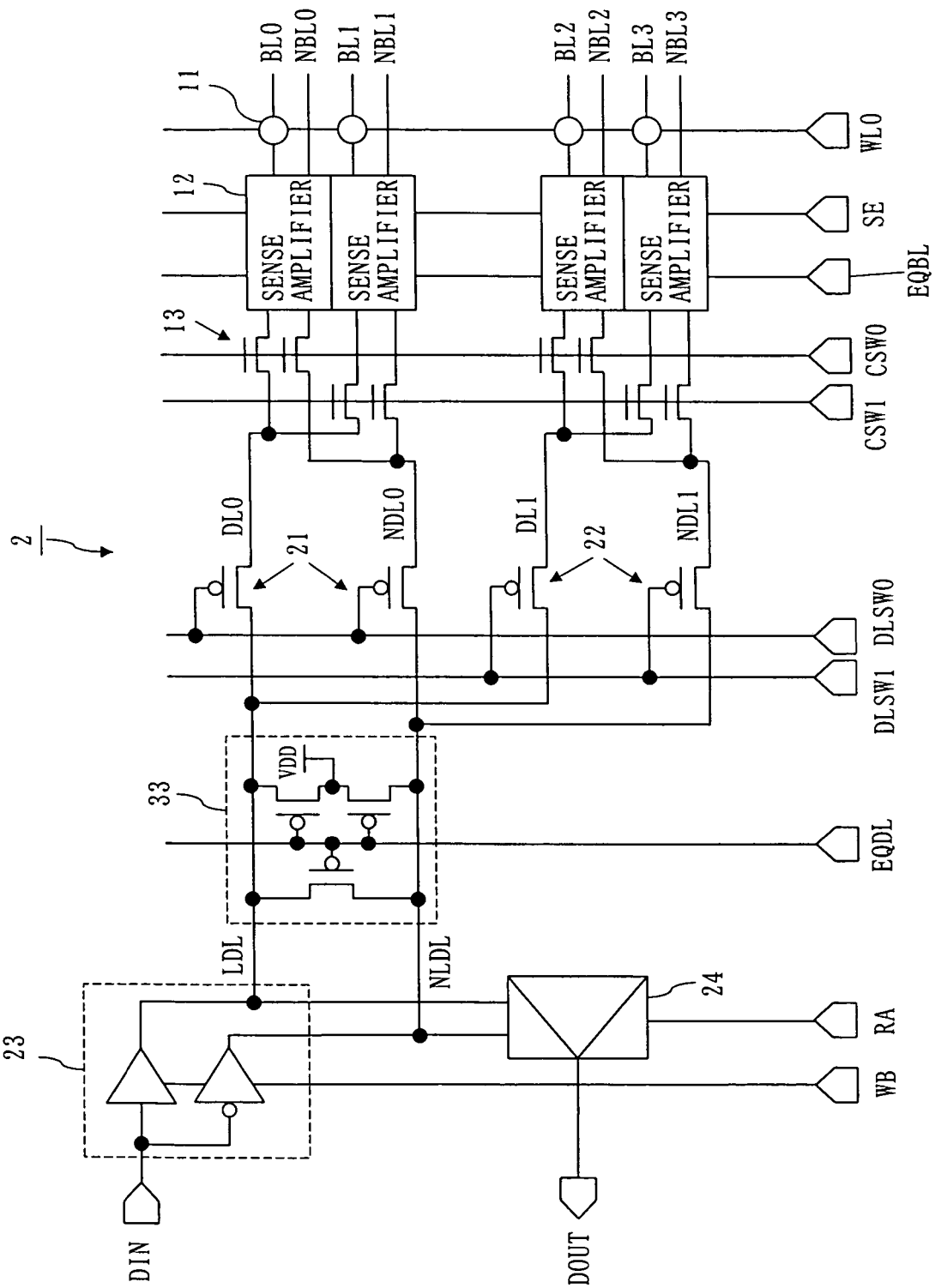
FIG. 4 is a diagram showing a structure of a semiconductor memory device according to a second embodiment of the present invention.

FIG. 4 is a diagram showing a structure of a semiconductor memory device according to a second embodiment of the present invention. The semiconductor memory device 2 of FIG. 4 is the same as the semiconductor memory device 1 of the first embodiment (FIG. 1), except that a precharge circuit 33 is used instead of the precharge circuits 31 and 32. In the second embodiment, the same components as those of the first embodiment are referenced with the same reference numerals and will not be explained.

The semiconductor memory device 2 comprises one precharge circuit 33 for each bit of an input/output signal so as to precharge a data line pair. The precharge circuit 33 is provided corresponding to the local data line pair LDL/NLDL and precharges the signal line in accordance with the precharge control signal EQDL. The semiconductor memory device 2 comprises only the precharge circuit corresponding to the local data line pair, but not a precharge circuit corresponding to a global data line pair. Therefore, the precharge of the global data line pairs DL0/NDL0 and DL1/NDL1 is performed by the precharge circuit 33 as described below.

Figure 5:
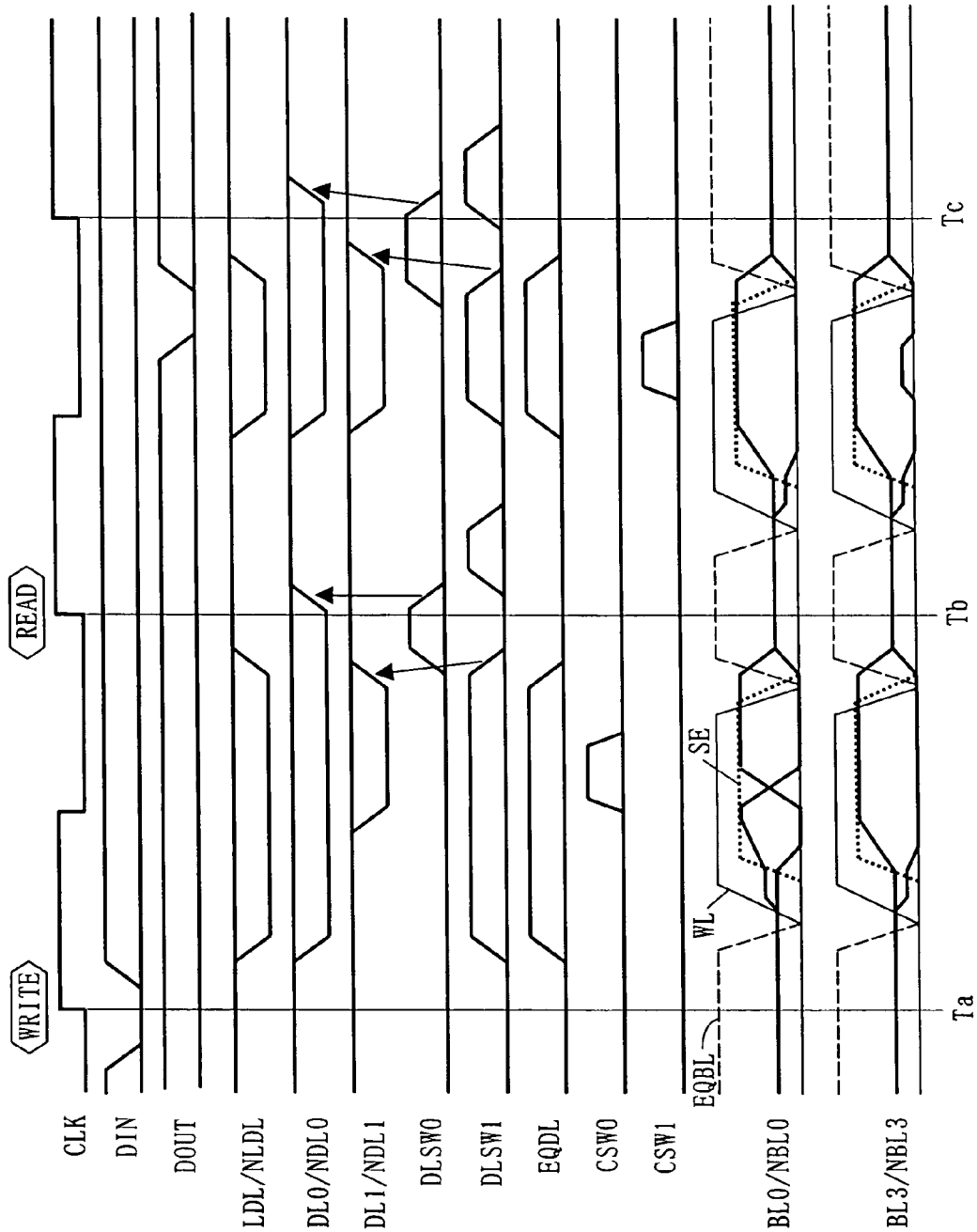
FIG. 5 is a timing chart of the semiconductor memory device of the second embodiment of the present invention.

A method of precharging the data lines in the semiconductor memory device 2 will be described with reference to FIG. 5. In the semiconductor memory device 2, the data line selection signals DLSW0 and DLSW1 are temporarily in the active state in a time-division manner after completion of a write process and after completion of a read process. An operation of the semiconductor memory device 2 after completion of the write process is the same as that after completion of the read process. Therefore, the operation after completion of the write process will be hereinafter described.

After completion of the write process, firstly, the column selection signal CSW0 is changed into the inactive state (LOW level). Next, the data line selection signal DLSW0 is changed into the inactive state (HIGH level), while the data line selection signal DLSW1 is changed into the active state (LOW level). At substantially the same time, the precharge control signal EQDL is changed into the active state (LOW level). Thereby, the global data line pair DL1/NDL1 is connected to the local data line pair LDL/NLDL, while the global data line pair DL0/NDL0 is disconnected from the local data line pair LDL/NLDL. Therefore, the local data line pair LDL/NLDL and the global data line pair DL1/NDL1 are precharged all together by the precharge circuit 33 while being connected to each other. In contrast to this, the global data line pair DL0/NDL0 is not precharged at this time point.

The local data line pair LDL/NLDL and the global data line pair DL1/NDL1 are precharged for a predetermined time, and thereafter, the data line selection signal DLSW0 is changed into the active state (LOW level), while the data line selection signal DLSW1 is changed into the inactive state (HIGH level). Thereby, the global data line pair DL0/NDL0 is connected to the local data line pair LDL/NLDL, while the global data line pair DL1/NDL1 is disconnected from the local data line pair LDL/NLDL. Therefore, at this time and thereafter, the local data line pair LDL/NLDL and the global data line pair DL0/NDL0 are precharged all together by the precharge circuit 33 while being connected to each other. During this precharge, the global data line pair DL1/NDL1 is held in the precharged state.

The local data line pair LDL/NLDL and the global data line pair DL0/NDL0 are precharged for a predetermined time, and thereafter, the data line selection signal DLSW1 is changed into the active state (LOW level). Thereby, the semiconductor memory device 2 is returned into the command waiting state. In the command waiting state, the local data line pair LDL/NLDL and the global data line pairs DL0/NDL0 and DL1/NDL1 are precharged all together by the precharge circuit 33 while being connected to each other, as required.

As described above, the semiconductor memory device 2 of the second embodiment comprises the precharge circuit corresponding to the local data line pair, but no precharge circuits corresponding to the global data line pairs. In the command waiting state, the data line selection switches 21 and 22 are in the connected state, so that the precharge circuit 33 performs a precharge operation. Therefore, in the command waiting state of the semiconductor memory device 2, the local data line pair and the global data line pairs are precharged all together while being connected to each other. Therefore, according to the semiconductor memory device 2, the local data line pair and the global data line pairs can be precharged without a precharge circuit corresponding to the global data line pairs. Therefore, the layout area of the peripheral circuit can be reduced by an amount corresponding to a precharge circuit corresponding to the global data line pairs.

Figure 12:
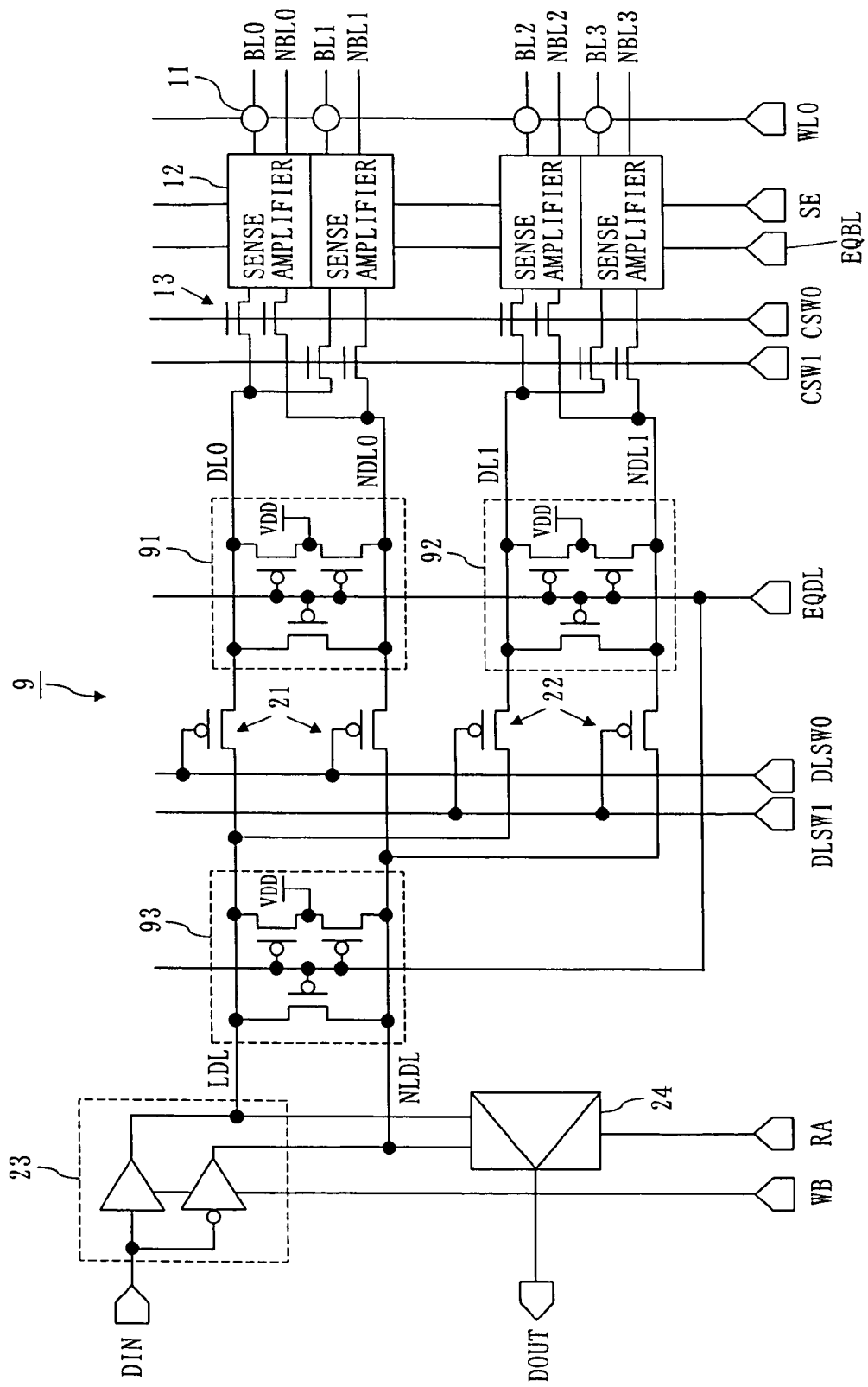
FIG. 12 is a diagram showing a structure of a conventional semiconductor memory device.

Generally, a size in a word line direction of a precharge circuit may be a bottleneck in the layout of a semiconductor memory device, so that bit lines may not be disposed at a minimum bit line pitch (this value is determined depending on a memory cell size or the like). On the other hand, the number of precharge circuits included in the semiconductor memory device 2 is reduced to ⅓ or less of that of conventional semiconductor memory devices (FIG. 12). The size of a precharge circuit which raises a problem with conventional semiconductor memory devices may be no problem with the semiconductor memory device 2, so that bit lines may be disposed at the minimum bit line pitch. Thus, not only the layout area of the peripheral circuit can be reduced by an amount corresponding to a precharge circuit, but also the bit line pitch can be decreased, thereby making it possible to significantly reduce the area of the memory array.

Further, the semiconductor memory device 2 precharges the global data line pairs DL0/NDL0 and DL1/NDL1 in a time-division manner before being transitioned from the command executing state to the command waiting state. Thereby, it is possible to prevent the single precharge circuit from precharging the local data line and a plurality of the global data lines all together. Therefore, a precharge circuit having substantially the same driving performance as conventional semiconductor memory devices can be used. Furthermore, the wire load of data lines which are precharged simultaneously can be reduced, thereby suppressing a voltage drop due to an increase in peak current.

In the semiconductor memory device 2, the global data line pairs are precharged in a time-division manner. However, when the wire load of the global data line pair is not significantly large compared to the performance of the precharge circuit, it is not necessary to precharge the global data line pairs in a time-division manner. Also in this case, before the semiconductor memory device 2 is transitioned from the command executing state to the command waiting state, only the local data line pair may be precharged while the local data line pair and the global data line pairs are separated from each other. Thereafter, all of the global data line pairs may be precharged together while the local data line pair and the global data line pairs are connected to each other. Further, as in the first embodiment, the data lines may be precharged to the LOW level. Alternatively, ½·H precharge may be performed with respect to the data lines.

Third Embodiment

Figure 6:
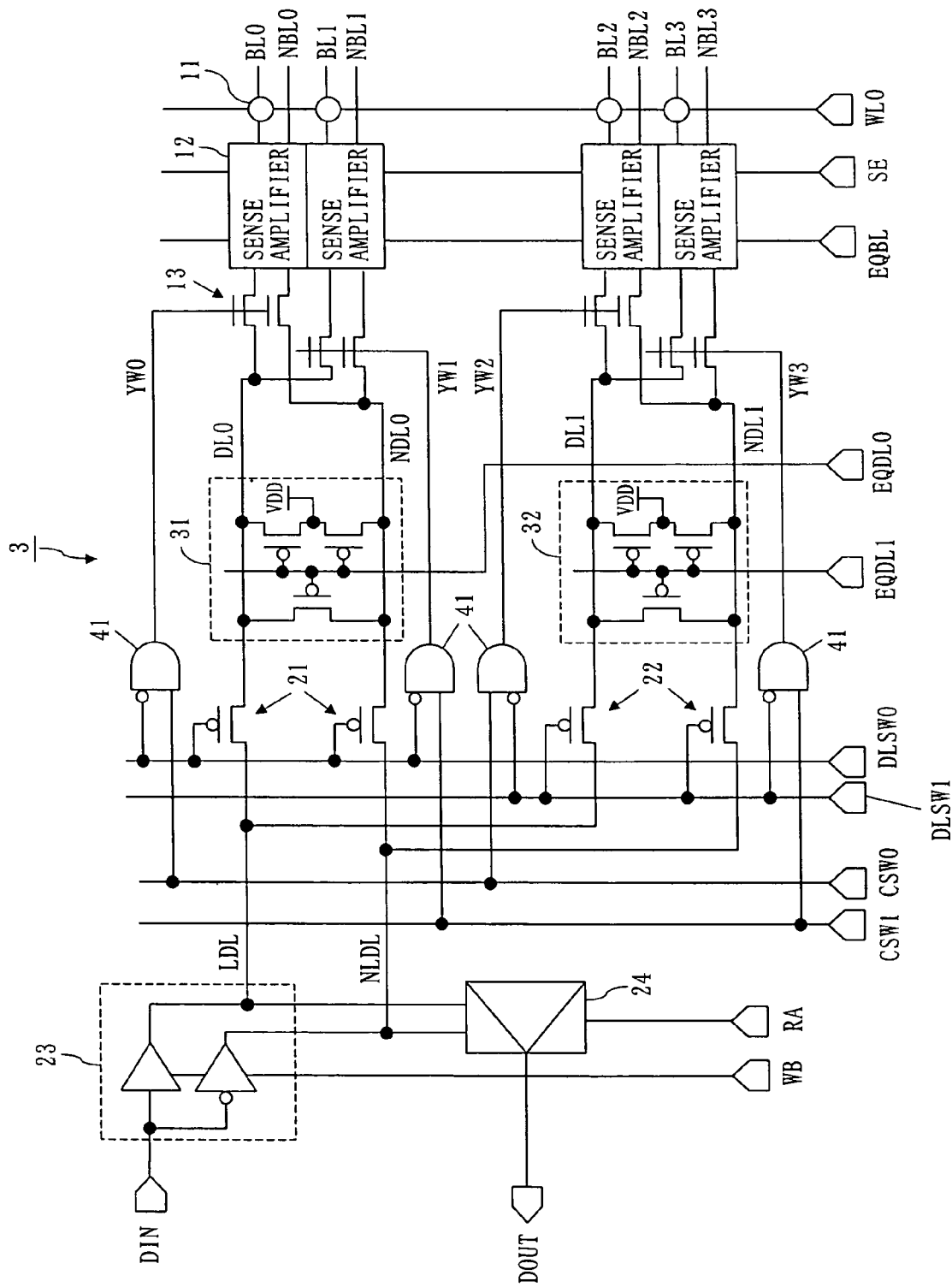
FIG. 6 is a diagram showing a structure of a semiconductor memory device according to a third embodiment of the present invention.

FIG. 6 is a diagram showing a structure of a semiconductor memory device according to a third embodiment of the present invention. The semiconductor memory device 3 of FIG. 6 is the same as the semiconductor memory device 1 of the first embodiment (FIG. 1), except that logic gates 41 are further provided and the precharge circuits 31 and 32 are controlled using different precharge control signals. In the third embodiment, the same components as those of the first embodiment will be described with the same reference numerals and will not be explained.

The semiconductor memory device 3 comprises two precharge circuits 31 and 32 for each bit of an input/output signal so as to precharge data line pairs. In the third embodiment, the precharge circuits 31 and 32 precharge signal lines in accordance with two precharge control signals different from each other, as is different from the first embodiment. More specifically, the precharge circuit 31 precharges mainly the global data line pair DL0/NDL0 in accordance with a precharge control signal EQDL0. The precharge circuit 32 precharges mainly the global data line pair DL1/NDL1 in accordance with a precharge control signal EQDL1. The precharge of the local data line pair LDL/NLDL is performed by the precharge circuits 31 and 32 as in the first embodiment.

The logic gates 41 output control signals YW0 to YW3 to the column selection switches 13. For example, the control signal YW0 is a logical product of the negation of the data line selection signal DLSW0 and the column selection signal CSW0, and serves as a control signal for the column selection switch 13 corresponding to the bit line pair BL0/NBL0. The control signals YW1 to YW3 are similar to the control signal YW0. Therefore, the column selection switch 13 is in the connected state when the column selection signal is in the active state (HIGH level) and the data line selection signal is in the active state (LOW level). In the other cases, the column selection switch 13 is in the open state.

A method of precharging the data lines in the semiconductor memory device 3 will be described with reference to FIG. 7. In the precharge method of FIG. 7, the precharge control signal EQDL0 is in the inactive state (HIGH level) when a command requiring the global data line pair DL0/NDL0 is executed (in this example, when the WRITE command with respect to the memory cell M0 is executed). In the other cases, the precharge control signal EQDL0 is in the active state (LOW level). The precharge control signal EQDL1 is in the inactive state (HIGH level) when a command requiring the global data line pair DL1/NDL1 is executed (in this example, the READ command with respect to the memory cell M3 is executed). In the other cases, the precharge control signal EQDL1 is in the active state (LOW level).

The control signal YW0 is in the active state (HIGH level) only if the column selection signal CSW0 is in the active state (HIGH level) and a command with respect to a memory cell 11 connected to the bit line pair BL0/NBL0 is executed (in this example, the WRITE command with respect to the memory cell M0 is executed). The control signal YW3 is in the active state (HIGH level) only if the column selection signal CSW1 is in the active state (HIGH level) and a command with respect to a memory cell 11 connected to the bit line pair BL3/NBL3 is executed (in this example, the READ command with respect to the memory cell M3 is executed). Note that, in this example, the control signals YW1 and YW2 are held in the inactive state (LOW level) in any of the command waiting state and the command executing state.

Figure 7:
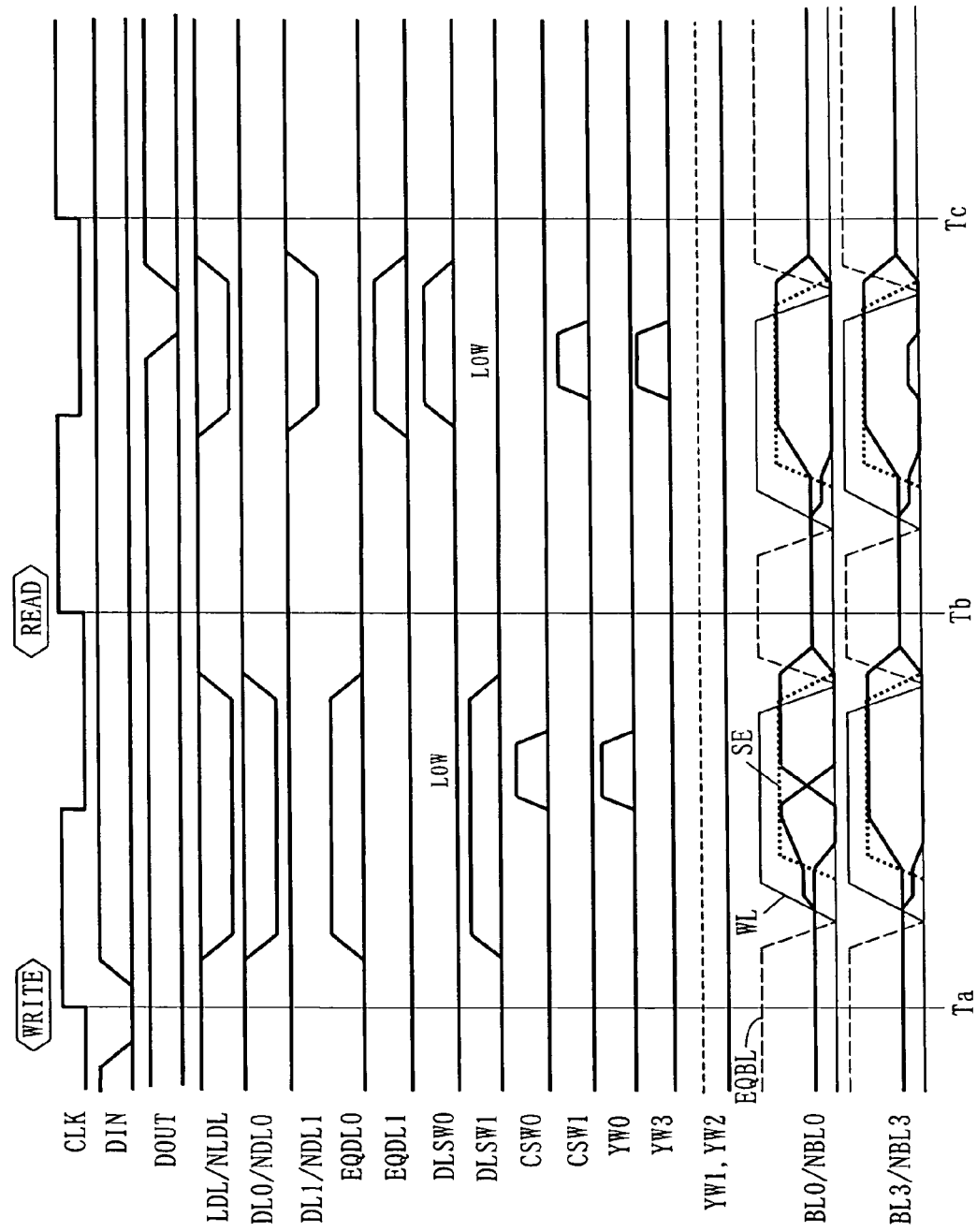
FIG. 7 is a timing chart of the semiconductor memory device of the third embodiment of the present invention.

In FIG. 7, in a command waiting state before time Ta, each signal line is controlled to have the same value as that of FIG. 2. In the command waiting state, all of the precharge control signals EQDL0 and EQDL1 are controlled to be in the active state (LOW level).

When the WRITE command is input at time Ta, signal lines other than the precharge control signals EQDL0 and EQDL1 and the control signals YW0 to YW3 are each changed in a manner similar to that in FIG. 2. The precharge control signal EQDL0 is changed in a manner similar to that of the precharge control signal EQDL of FIG. 2. The control signal YW0 is changed in a manner similar to that of the column selection signal CSW0 of FIG. 2. Therefore, the semiconductor memory device 3 can write data input through the input terminal DIN into the memory cell M0 as in the first embodiment.

During this time, the control signals YW1 to YW3 are held in the inactive state (LOW level), while the precharge control signal EQDL1 is held in the active state (LOW level). Therefore, the global data line pair DL1/NDL1, which is not required for execution of the command, is held in the precharged state while being disconnected from the local data line pair LDL/NLDL and the sense amplifier 12. After the write process is completed and the control signal YW0 is changed into the inactive state (LOW level), the data line selection signal DLSW1 is changed into the active state (LOW level) and the precharge control signal EQDL0 is also changed into the active state (LOW level). Thereby, the local data line pair LDL/NLDL and the global data line pairs DL0/NDL0 and DL1/NDL1 are precharged to be ready for the next command.

When the READ command is input at time Tb, signal lines other than the precharge control signals EQDL0 and EQDL1 and the control signals YW0 to YW3 are changed in a manner similar to when the WRITE command is input, as in FIG. 2. The precharge control signal EQDL1 is changed in a manner similar to that of the precharge control signal EQDL of FIG. 2. The control signal YW3 is changed in a manner similar to that of the column selection signal CSW1 as in FIG. 2. Therefore, the semiconductor memory device 3 can output data read from the memory cell M3 through the output terminal DOUT as in the first embodiment.

During this time, the control signals YW0 to YW2 are held in the inactive state (LOW level), while the precharge control signal EQDL0 is held in the active state (LOW level). Therefore, the global data line pair DL0/NDL0, which is not required for execution of the command, is held in the precharged state while being disconnected from the local data line pair LDL/NLDL and the sense amplifier 12. After the read process is completed and the control signal YW3 is changed into the inactive state (LOW level), the data line selection signal DLSW0 is changed into the active state (LOW level) and the precharge control signal EQDL1 is also changed into the active state (LOW level). Thereby, the local data line pair LDL/NLDL and the global data line pairs DL0/NDL0 and DL1/NDL1 are precharged to be ready for the next command.

As described above, in the semiconductor memory device 3 of the third embodiment, the connection state of the sense amplifier 12 and the global data line pairs DL0/NDL0 and DL1/NDL1 is controlled based on address information of a memory cell to be accessed. Thereby, the sense amplifier 12 required for command execution is selectively operated, resulting in a reduction in current flowing through the sense amplifier 12. Further, in the semiconductor memory device 3, a data line which is not required for the command execution is held in the precharged state, thereby making it possible to reduce a precharge current in the data line which is not required for the command execution. Thus, the power consumption of the semiconductor memory device can be reduced.

In recent large-volume semiconductor memory devices, the wire load of data lines is considerably large. For example, it is said that the power consumption of data lines accounts for about a half of the total power consumption in a semiconductor memory device produced by the 0.13-µm process. Therefore, it is very important to reduce the power consumption of data lines in terms of the performance of a semiconductor memory device.

In the semiconductor memory device 3, of the global data lines whose wire load is large, one which is not required for command execution is precharged to a power source level. Therefore, the global data line functions as a local smoothing capacitance to subsidiarily suppressing a voltage change. Further, since the global data line which is not required for the command execution is fixed to the particular voltage level, it functions as a shield line for the global data line which is required for the command execution. Thereby, noise interference between the global data lines can be suppressed, thereby making it possible to prevent a malfunction of the semiconductor memory device. Needless to say, since the number of precharge circuits can be reduced, the power consumption and layout area of the semiconductor memory device can be reduced, as in the first embodiment.

Figure 8:
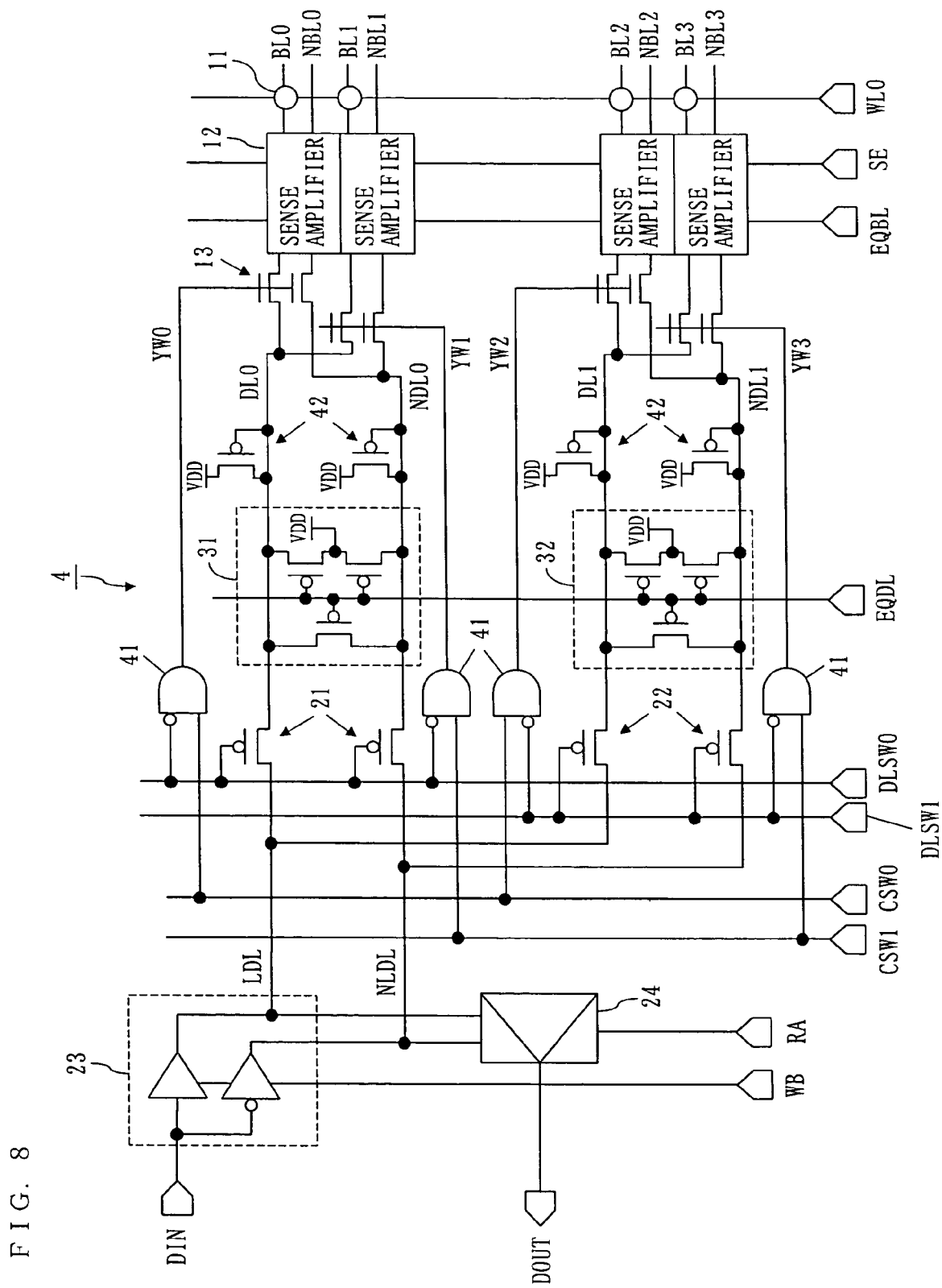
FIG. 8 is a diagram showing a structure of a semiconductor memory device according to a first variation of the third embodiment of the present invention.

FIG. 8 is a diagram showing a semiconductor memory device according to a first variation of the third embodiment of the present invention. The semiconductor memory device 4 of FIG. 8 is the same as the semiconductor memory device 3 of FIG. 6, except that clamp transistors 42 are further provided and the precharge circuits 31 and 32 are controlled using the same precharge control signal. In the semiconductor memory device 4, the same components as those of the semiconductor memory device 3 are referenced with the same reference numerals and will not be explained.

The semiconductor memory device 4 comprises the clamp transistors 42 corresponding to the global data line pairs DL0/NDL0 and DL1/NDL1. The drain and gate terminals of the clamp transistor 42 are connected to the global data line pairs DL0/NDL0 and DL1/NDL1, while the source terminal of the clamp transistor 42 is connected to the same power source as that which the precharge circuits 31 and 32 are connected to. As the clamp transistor 42, a transistor having a sufficiently small performance is used not to have an influence on data transfer during execution of a command. In the semiconductor memory device 4, a P-channel transistor is used as the clamp transistor 42.

A method of precharging the data lines in the semiconductor memory device 4 is substantially the same as the data line precharging method of the semiconductor memory device 3 of FIG. 6. Note that the two methods are different in the following point. In the semiconductor memory device 4, both the precharge circuits 31 and 32 are controlled using the precharge control signal EQDL. Therefore, one of the global data line pairs DL0/NDL0 and DL1/NDL1, the one being not required for command execution, is in a high-impedance state. The high-impedance state is clamped using the clamp transistor 42. In this case, when a voltage of the global data line not required for the command execution exceeds a threshold voltage Vt of the clamp transistor 42, a current is supplied to the global data line. Therefore, a data line which is not required for command execution can function as a shield line for a data line required for the command execution, so that the precharge circuits 31 and 32 do not need to be controlled at different timings.

Figure 9:
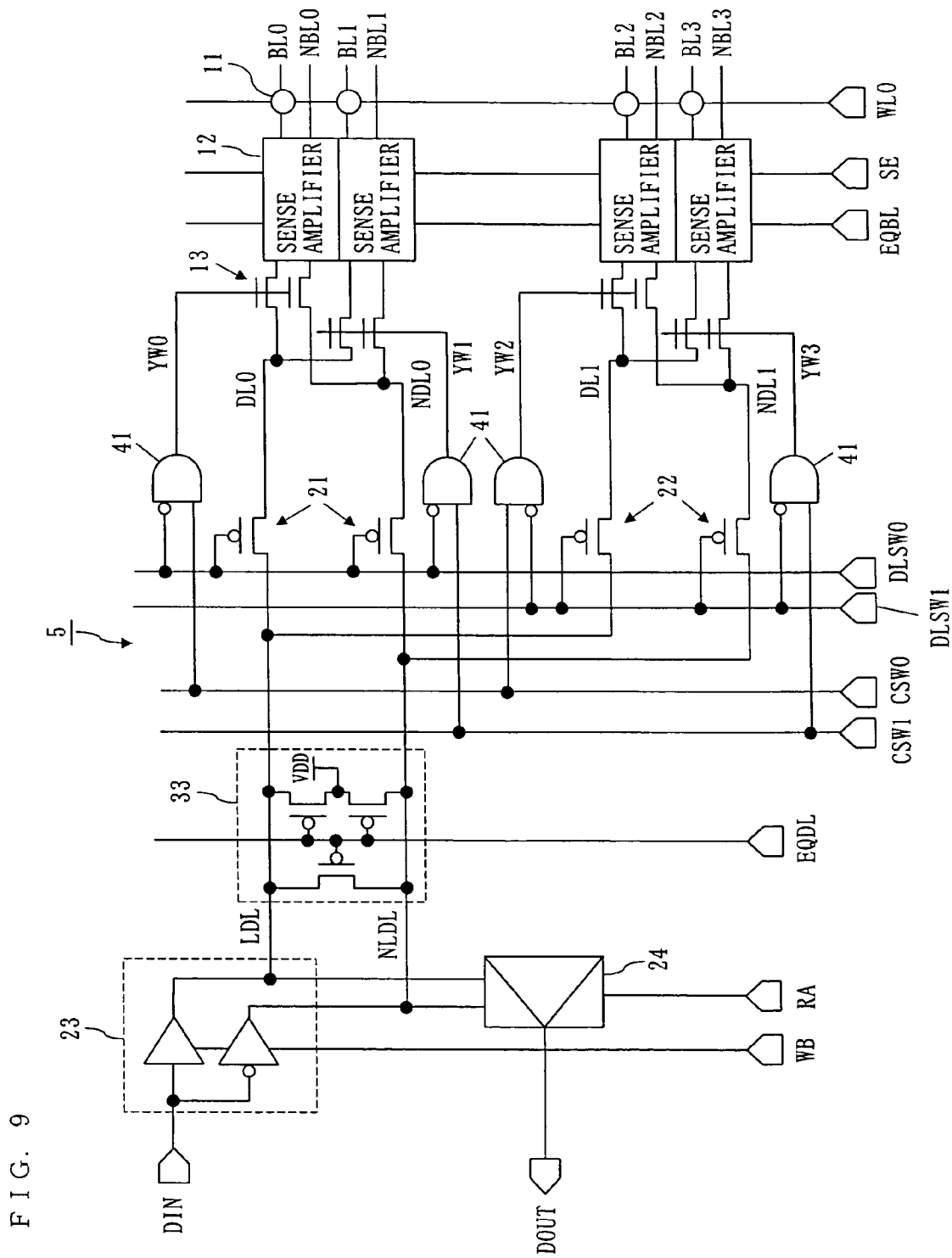
FIG. 9 is a diagram showing a structure of a semiconductor memory device according to a second variation of the third embodiment of the present invention.
Figure 10:
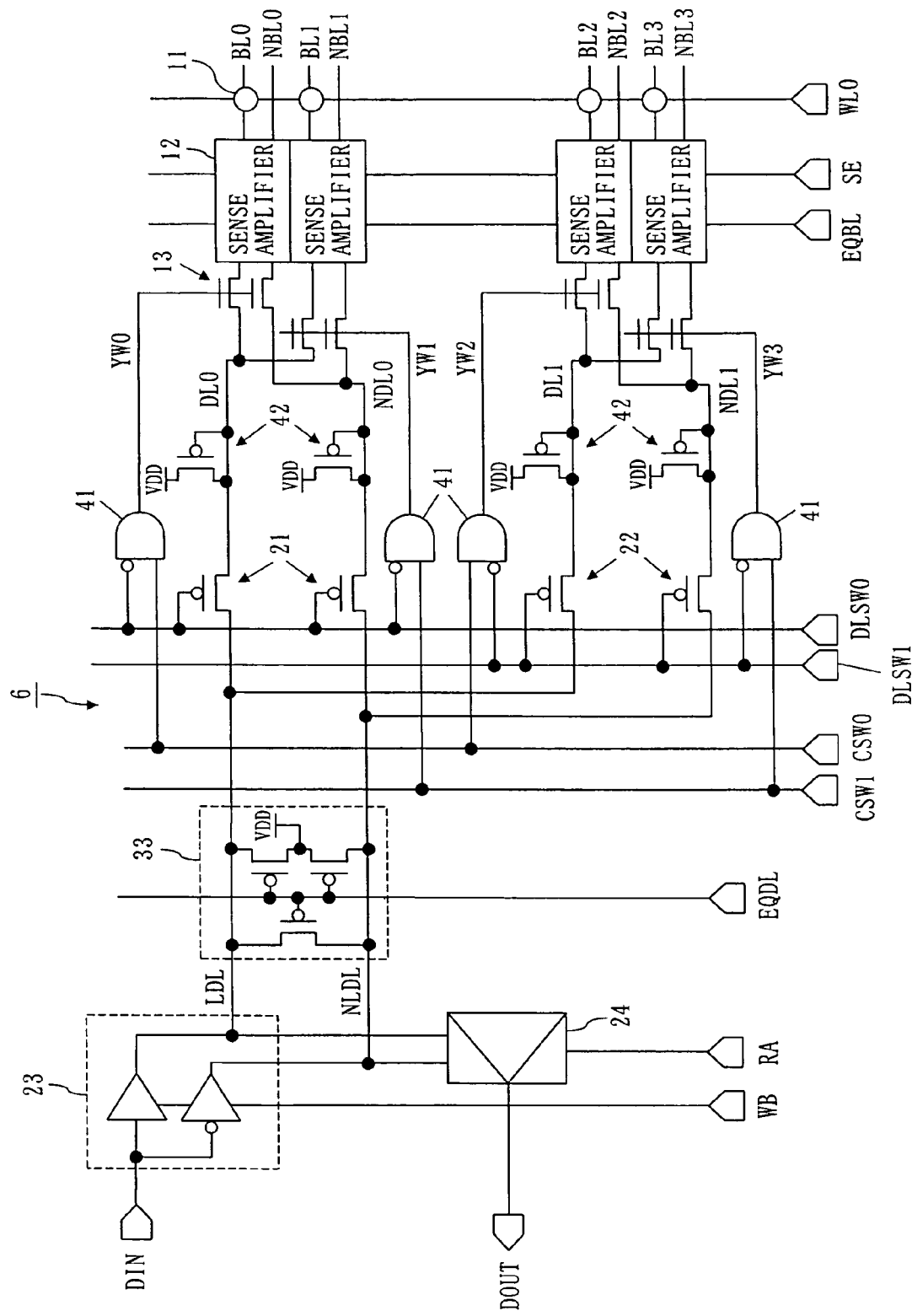
FIG. 10 is a diagram showing a structure of a semiconductor memory device according to a third variation of the third embodiment of the present invention.
Figure 11:
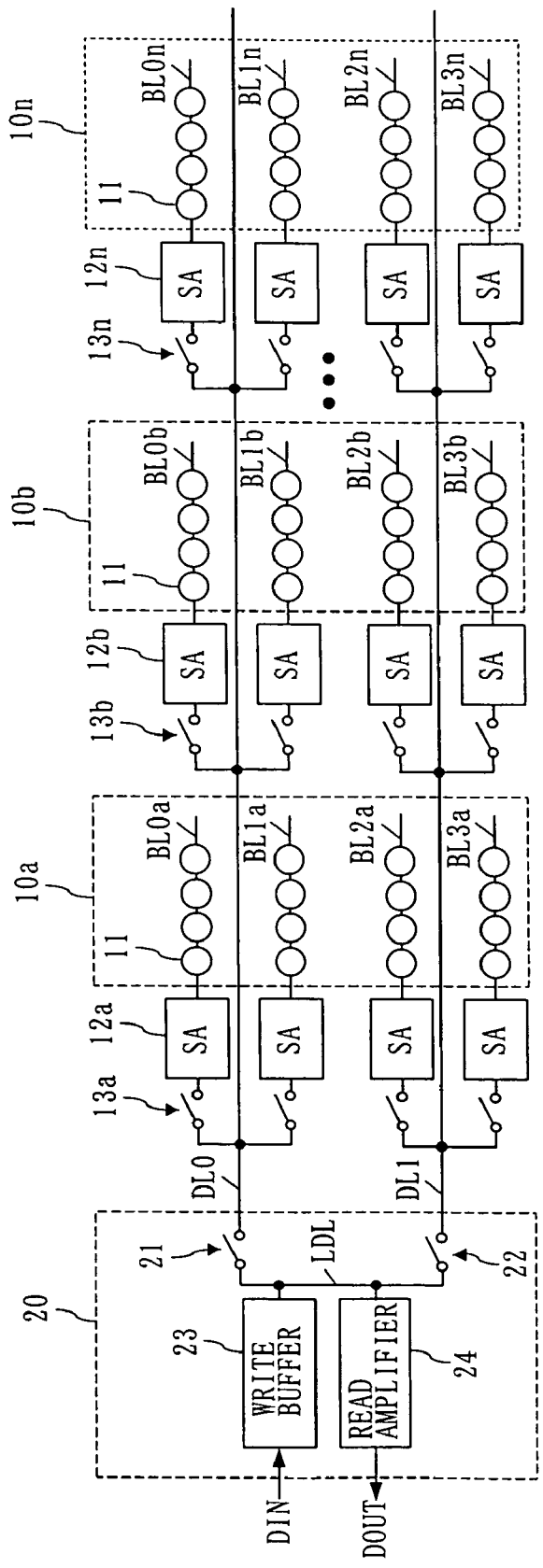
FIG. 11 is a diagram showing a general structure of a semiconductor memory device.

The semiconductor memory device which is obtained by adding the logic gates 41 and the clamp transistors 42 to the semiconductor memory device comprising only precharge circuits corresponding to global data line pairs, has heretofore described. Alternatively, a semiconductor memory device may be obtained by adding the logic gates 41 and/or the clamp transistors 42 to the semiconductor memory device comprising only a precharge circuit corresponding to a local data line pair. Semiconductor memory devices 5 and 6 shown in FIGS. 9 and 10 are obtained by adding the logic gate 41 and/or the clamp transistor 42 to the semiconductor memory device 2 (FIG. 4) of the second embodiment. The semiconductor memory devices 5 and 6 have effects similar to those of the semiconductor memory devices 3 and 4.

As described above, a P-channel transistor is used as the clamp transistor 42. Alternatively, an N-channel transistor may be used as the clamp transistor 42, depending on a method of precharging the data lines. Further, as in the first and second embodiments, the data line may be precharged to the LOW level, or ½·H precharge may be performed with respect to the data line.

Needless to say, a semiconductor memory device may be composed by arbitrarily combining the features of the first to third embodiment, depending on the volume, bit structure and the like of the semiconductor memory device.

The semiconductor memory device of the present invention has low power consumption and a small area, and therefore, can be used in dynamic random access memories and semiconductor integrated circuits. Particularly, the semiconductor memory device of the present invention is useful for mobile apparatuses, which rigorously require low power consumption.

While the invention has been described in detail, the foregoing description is in all aspects illustrative and not restrictive. It is understood that numerous other modifications and variations can be devised without departing from the scope of the invention.

What is claimed is:

1. A semiconductor memory device having hierarchically structured data lines, comprising:
   a plurality of memory cells disposed in a first direction and a second direction perpendicular to each other;
   a plurality of word lines disposed in the first direction and used for selecting the memory cells disposed in the second direction simultaneously;
   a plurality of bit line pairs disposed in the second direction, and connected to and shared by the memory cells disposed in the first direction;
   a plurality of sense amplifiers for amplifying signals on the bit line pairs;
   a write circuit for writing externally input data into the memory cell;
   a read circuit for outputting data read from the memory cell to an outside;
   a plurality of global data line pairs each provided corresponding to one or more of the bit line pairs;
   a local data line pair provided corresponding to two or more of the global data line pairs and connected to the write circuit and the read circuit;
   a plurality of data line selection switches provided corresponding to the global data line pairs and used for switching states of connection between the global data line pairs and the local data line pair; and
   a plurality of precharge circuits provided corresponding to the global data line pairs and operated in accordance with a received control signal,
   wherein, in a command waiting state, all of the data line selection switches are in a connected state and all of the precharge circuits are operated, and
   wherein, if a command state is transitioned from the command waiting state, in which precharge processing is performed, to a command executing state, in which write processing or read processing is performed, one of the plurality of data line selection switches, which is required for command execution, is held in the connected state while the remainder of the plurality of data line selection switches are transitioned from being in the connected state to being in an open state, and operations of all of the precharge circuits are stopped.

2. The semiconductor memory device according to claim 1, wherein, in the command executing state, in which read processing is performed, one of the plurality of data line selection switches, which is not required for command execution, in which read processing is performed, is in the open state while the read circuit is receiving data.

3. A semiconductor memory device having hierarchically structured data lines, comprising:
   a plurality of memory cells disposed in a first direction and a second direction perpendicular to each other;
   a plurality of word lines disposed in the first direction and used for selecting the memory cells disposed in the second direction simultaneously;
   a plurality of bit line pairs disposed in the second direction, and connected to and shared by the memory cells disposed in the first direction;
   a plurality of sense amplifiers for amplifying signals on the bit line pairs;
   a write circuit for writing externally input data into the memory cell;
   a read circuit for outputting data read from the memory cell to an outside;
   a plurality of global data line pairs each provided corresponding to one or more of the bit line pairs;
   a local data line pair provided corresponding to two or more of the global data line pairs and connected to the write circuit and the read circuit;
   a plurality of data line selection switches provided corresponding to the global data line pairs and used for switching states of connection between the global data line pairs and the local data line pair; and
   a plurality of precharge circuits provided corresponding to the global data line pairs and operated in accordance with a received control signal,
   wherein, in a command waiting state, all of the data line selection switches are in a connected state and all of the precharge circuits are operated, and
   wherein, if a command state is transitioned from the command waiting state, in which precharge processing is performed, to a command executing state, in which write processing or read processing is performed, one of the plurality data line selection switches, which is required for command execution, is held in a connected state while the remainder of the plurality of data line selection switches are transitioned from being in the connected state to being in an open state, and an operation of one of the plurality of precharge circuits corresponding to the global data line pairs, which is required for the command execution, is stopped while operations of the remainder of the plurality of precharge circuits are continued.

4. The semiconductor memory device according to claim 1, further comprising a plurality of column selection switches provided corresponding to the bit line pairs and used for switching states of connection between the global data line pairs and the bit line pair,
   wherein, in the command waiting state, all of the column selection switches are in an open state,
   and wherein if the command state is transitioned from the command waiting state, in which precharge processing is performed, to the command executing state, in which write processing or read processing is performed, one of the plurality of column selection switches, which is required for command execution, is in a connected state while the remainder of the plurality of column selection switches are held in the open state.

5. The semiconductor memory device according to claim 4, further comprising a plurality of clamp transistors each having a drain terminal, a gate terminal and a source terminal and provided corresponding to the global data line pairs, wherein the drain terminal and the gate terminal are connected to the global data line pairs and the source terminal is connected to the same power source as that for the precharge circuit,
   wherein all of the precharge circuits are operated at the same timing.

6. The semiconductor memory device according to claim 1, wherein the data line selection switches and the precharge circuits are each composed of a transistor having the same conductivity type.

* * * * *